United States Patent
Srivastava et al.

(10) Patent No.: US 9,705,481 B1
(45) Date of Patent: Jul. 11, 2017

(54) AREA-OPTIMIZED RETENTION FLOP IMPLEMENTATION

(71) Applicant: Texas Instruments Incorporated, Dallas, TX (US)

(72) Inventors: Sudesh Chandra Srivastava, Bangalore (IN); Vivek Singhal, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/986,444

(22) Filed: Dec. 31, 2015

(51) Int. Cl.
*H03K 3/35* (2006.01)
*H03K 3/3562* (2006.01)
*H01L 27/088* (2006.01)
*H01L 27/02* (2006.01)
*H01L 29/10* (2006.01)

(52) U.S. Cl.
CPC ....... *H03K 3/3562* (2013.01); *H01L 27/0207* (2013.01); *H01L 27/088* (2013.01); *H01L 29/1095* (2013.01)

(58) Field of Classification Search
CPC ..... H03K 19/00315; H03K 19/018521; H03K 2217/0018; H01L 27/092; H01L 27/1107; H01L 27/0886; H01L 27/0207; H01L 7/0266
USPC .......................... 327/199, 200, 201, 202, 203
See application file for complete search history.

(56) References Cited

U.S. PATENT DOCUMENTS

2014/0197883 A1*  7/2014  Sinha ................. G05F 3/205
                                                    327/537
2016/0072484 A1*  3/2016  Jarrar ................. H03K 3/0372
                                                    327/202

* cited by examiner

*Primary Examiner* — John Poos
(74) *Attorney, Agent, or Firm* — Ronald O. Neerings; Charles A. Brill; Frank D. Cimino

(57) ABSTRACT

An integrated circuit device having a p-well plane, a plurality of substantially parallel n-well rows, and a logic cell. The p-well plane is comprised of p-type semiconductor material. Each n-well row comprises an n-type layer disposed on the surface of the p-well plane. The plurality of n-well rows includes a first n-well row and a second n-well row. The logic cell is arranged on the p-well plane and the footprint of the logic cell encompasses both the first and second n-well rows.

18 Claims, 4 Drawing Sheets

AREA-OPTIMIZED RETENTION FLOP IMPLEMENTATION

BACKGROUND

With the ever-increasing need for increased battery life for battery-powered devices, the need for low-power systems and SOCs (system on a chip) is also increasing. This gives rise to the need for power-managed designs with multiple power/voltage domains. In a design having a power domain, often there is a requirement to preserve state (of a flip-flop) even while the power domain is switched off. This state, often known as the standby state, helps reduce power-down and power-up time. To preserve this state, retention flops are widely used in almost all power-managed SOCs.

A typical retention flop includes a master latch and a slave latch, with the slave latch storing the state during power down. The slave latch of a retention flop must be powered by an always-on (AON) retention supply to store data when the associated device is turned off. The n-well and drain of the slave latch must to be connected to the always-on supply. To reduce leakage, the slave latch is often designed with high-voltage-threshold (HVT) transistors, while the master-latch is implemented using standard-voltage-threshold (SVT) transistors to target performance. Thus, such HVT transistors will at times be referred to herein as AON logic and such SVT transistors as switchable logic.

N-well leakage of SVT transistors is quite higher than that of HVT transistors. The n-well and drain of the storing latch of a retention flop must be connected to an always-on power supply, whereas the n-well and drain of the master latch of the retention flop should be connected to a switchable power supply in order to limit leakage current during retention/stand-by mode. Since the n-wells of the master latch and slave latch of the logic cell are connected to two different power supplies, such a logic cell must have two separate n-wells, which will also be referred to herein as a split n-well.

FIG. 1 is a schematic circuit diagram of an illustrative retention flop. Note that the retention flop implementation shown in FIG. 1 is merely illustrative and that any number of different implementations are possible. The retention flop 100 of FIG. 1 is a D flip-flop and includes a master latch 110 and a slave latch 120. The illustrative master latch 110 of FIG. 1 includes inverter 112, inverter 114 and inverter 116. Slave latch 120 includes inverter 122 and inverter 124. The master latch 110 captures a new value D at the input to inverter 112, while the slave latch 120 retains the value that was previously received by the master latch 110. A pass gate 130 passes the value held in the master latch 110 to the slave latch 120 dependent upon a clock signal CK. Each of the inverters 112, 114, 116, 122, 124, and 135 are illustratively composed of one or more transistors, such as metal oxide semiconductor (MOS) transistors. Together, the master latch 110, slave latch 120, pass gate 130, and inverter 135 make up what is often referred to as a logic cell. In general, the term logic cell, as used herein, refers to a functional grouping of electronic elements such as transistors that form a logic element such as the D flip-flop of FIG. 1.

The master latch 110 is coupled to the always-on power supply $V_{DDC}$ via a power switch 140. The master latch 110 is illustratively disconnected from the power supply $V_{DDC}$ by power switch 140 when the device is turned off or placed in a stand-by state in order to conserve battery power. In contrast, the slave latch 120 is connected directly to the always-on power supply $V_{DDC}$ in order to maintain the data contents stored by the slave latch even when the device is turned off or placed in a standby state. Thus in device implementations wherein the master latch 110 and slave latch 120 are comprised of MOS transistors, the n-wells of the master latch transistors are coupled to the always-on power supply $V_{DDC}$ via power switch 140, while the n-wells of the slave latch transistors are connected directly to the always-on power supply $V_{DDC}$. In alternative implementations, the master latch 110 is connected to a different, switchable, power supply, rather than connected to an always-on supply via a power switch. Since the n-wells of the master latch 110 and slave latch 120 of the logic cell 100 are connected to two different power supplies, such a logic cell must have two separate n-wells.

FIG. 2 is a schematic top view of an integrated circuit power domain. FIG. 2 shows typical placement of standard logic cells in such a power domain. The power domain block 200 includes a p-well plane 220 comprised of positively doped (p+) semiconductor material. The power domain block 200 is conceptually divided into multiple rows, commonly referred to as cell rows 202, 204, 206, 208, 210, 212. The power domain block 200 further includes a plurality of substantially parallel n-well drawings 230, 232, 234, each comprising a layer of negatively doped (n+) semiconductor material deposited on top of the p-well-plane 220. Such n-well drawings 230, 232, and 234 will be alternatively referred to as n-well rows herein. Typically two adjacent cell rows share a common n-well drawing, with one cell row being flipped (sometimes referred to as a south row) and the other cell row not being flipped (sometimes referred to as a north row). For example, in FIG. 2, cell row 202 shares n-well row 230 with cell row 204, cell row 206 shares n-well row 232 with cell row 208, and cell row 210 shares n-well row 234 with cell row 212. Thus standard logic cell 240 shares n-well 234 with standard logic cell 242. Double-height standard logic cell 244 also makes use of n-well 234 as well as n-well 232. Double-height power switch cell 250 utilizes only n-well 232, which falls fully inside the footprint of the power switch cell 250, as opposed to the power switch cell 250 sharing n-well 232 with an adjacent flipped cell row. FIG. 2 also shows power tap cells 260-280 which are electrically coupled to the n-well rows 230, 232, 234 and also coupled to a power source to provide power to the n-wells 230, 232, 234. For example, n-well row 230 is coupled to tap cells 260, 266, 270 and 276; n-well row 232 is coupled to tap cells 262, 268, 272 and 278; and n-well row 234 is coupled to tap cells 264, 270, and 280. Each n-well row 230, 232, 234 has tap cells placed at regular intervals along its length in order to minimize voltage drops resulting from resistive losses.

In the illustrative power domain block 200 of FIG. 2, all of the n-wells are connected to the same power supply. But in cases where a logic cell requires access to two different power supplies, such as in the example of FIG. 1, where the master latch 110 is powered by a switchable power supply and the slave latch 120 is powered by an always-on power supply, such a cell has to have two different n-wells that are separated from each other. Various solutions exist for implementing such n-well separation. One such existing solution is shown in FIG. 3. FIG. 3 is a schematic diagram of a double-height logic cell 300 occupying two adjacent cell rows 310 and 312. Logic cell 300 is commonly referred to as a "double-height" logic cell although the dimension occupied by the two logic cell rows 310 and 312 does not necessarily represent "height" in the traditional sense but may also represent other dimensions such as width or length. In the solution represented by FIG. 3, the standard-voltage-threshold (SVT) logic of the master latch of logic cell 300 is situated proximate, and utilizes, the n-well row 320. N-well row 320 is coupled to a power switch 330 via one or more tap cells (not shown) that are placed at regular intervals along the length of n-well row 320 as shown in FIG. 2. The power switch 330 selectably couples the SVT n-well row 320 to an always-on power supply $V_{DDC}$. Alternatively, the SVT n-well row 320 can be coupled to a switchable power supply that is wholly independent of the always-on power supply $V_{DDC}$. A second n-well 340 is situated fully contained within, but isolated from, the n-well row 320. The high-voltage-threshold (HVT) logic of the slave latch of logic cell 300 is situated proximate, and utilizes, this second n-well 340. HVT n-well 340 is coupled to the always-on power supply $V_{DDC}$. An AON tap cell 350 is placed inside each logic cell, illustratively situated within the footprint of the HVT n-well 340, coupling the HVT n-well 340 to the always-on power supply $V_{DDC}$.

The prior art solution represented by FIG. 3 requires an area increase of the retention cell. The power domain of the n-well row 320 is switchable; thus to prevent a spacing requirement from an adjacent cell, the always-on n-well 340 is sandwiched between switchable n-wells. The AON tap connection requires extra area inside the cell 300 to accommodate the tap-cell 350 and maintain spacing between n-well 320 and n-well 340. Such an implementation is also susceptible to latch-up issues due to the narrow n-well connection between the switchable n-well islands 360 and 370.

Another prior art n-well separation solution is shown in FIG. 4. FIG. 4 is a schematic diagram of a double-height logic cell 400 occupying two adjacent cell rows 410 and 412. In the solution represented by FIG. 4, one side of logic cell 400 has a switchable n-well 420 while another side of the cell 400 has an always-on n-well 440. The standard-voltage-threshold logic of the master latch of logic cell 400 is situated proximate, and utilizes, the switchable n-well 420, which is coupled to a switchable power supply 430 via a tap cell (not shown) that, in some implementations, is coupled to the n-well 420 outside of the footprint of the logic cell 400. The high-voltage-threshold logic of the slave latch of logic cell 400 is situated proximate, and utilizes, the always-on n-well 440, which is coupled to an always-on power supply $V_{DDC}$ via a tap cell (not shown) that, in some implementations, is coupled to the n-well 440 outside of the footprint of the logic cell 400. An advantage of the n-well separation solution of FIG. 4 is that adjacent cells can be arranged "flipped" relative to each other. For example, a cell to the right of logic cell 400 can be arranged such that it shares the always-on n-well 440 with logic cell 400, and a cell to the left of logic cell 400 can be arranged such that it shares the switchable n-well 420 with logic cell 400. But since the n-wells 420 and 440 are not continued, the solution of FIG. 4 requires tap cells between standard logic cells, which increases the area required by this solution. Additionally, the n-well spacing between the two n-wells 420 and 440 needs to be maintained within the cell, further increasing the area requirement.

SUMMARY

An illustrative aspect of this disclosure is directed to an integrated circuit device having a p-well plane, a plurality of substantially parallel n-well rows, and a logic cell. The p-well plane is comprised of p-type semiconductor material. Each n-well row comprises an n-type layer disposed on the surface of the p-well plane. The plurality of n-well rows includes a first n-well row and a second n-well row. The logic cell is arranged on the p-well plane and the footprint of the logic cell encompasses both the first and second n-well rows.

Another illustrative aspect of this disclosure is directed to an integrated circuit logic cell that includes a p-well plane, a first n-well row, a second n-well row, and first, second, third and fourth parallel and contiguous cell rows. The p-well plane is comprised of p-type semiconductor material. The first n-well row is comprised of an n-type layer disposed on the surface of the p-well plane. The second n-well row is substantially parallel to the first n-well row and is comprised of an n-type layer disposed on the surface of the p-well plane. The first and second logic cell rows are parallel to and share the first n-well row, and the third and fourth logic cell rows are parallel to and share the second n-well row.

Another illustrative aspect of this disclosure is directed to an integrated circuit device having a p-well plane, a plurality of substantially parallel n-well rows, and a logic cell. The p-well plane is comprised of p-type semiconductor material. Each of the plurality of n-well rows is comprised of an n-type layer disposed on the surface of the p-well plane. The plurality of n-well rows includes a first n-well row coupled to a switchable power supply and a second n-well row coupled to an always-on power supply. The logic cell is arranged on the p-well plane, with the footprint of the logic cell encompassing both the first and second n-well rows. The logic cell includes at least one standard-voltage-threshold (SVT) transistor and at least one high-voltage-threshold (HVT) transistor. The at least one SVT transistor utilizes the first n-well row and the at least one HVT transistor utilizes the second n-well row.

DETAILED DESCRIPTION

Figure 1:
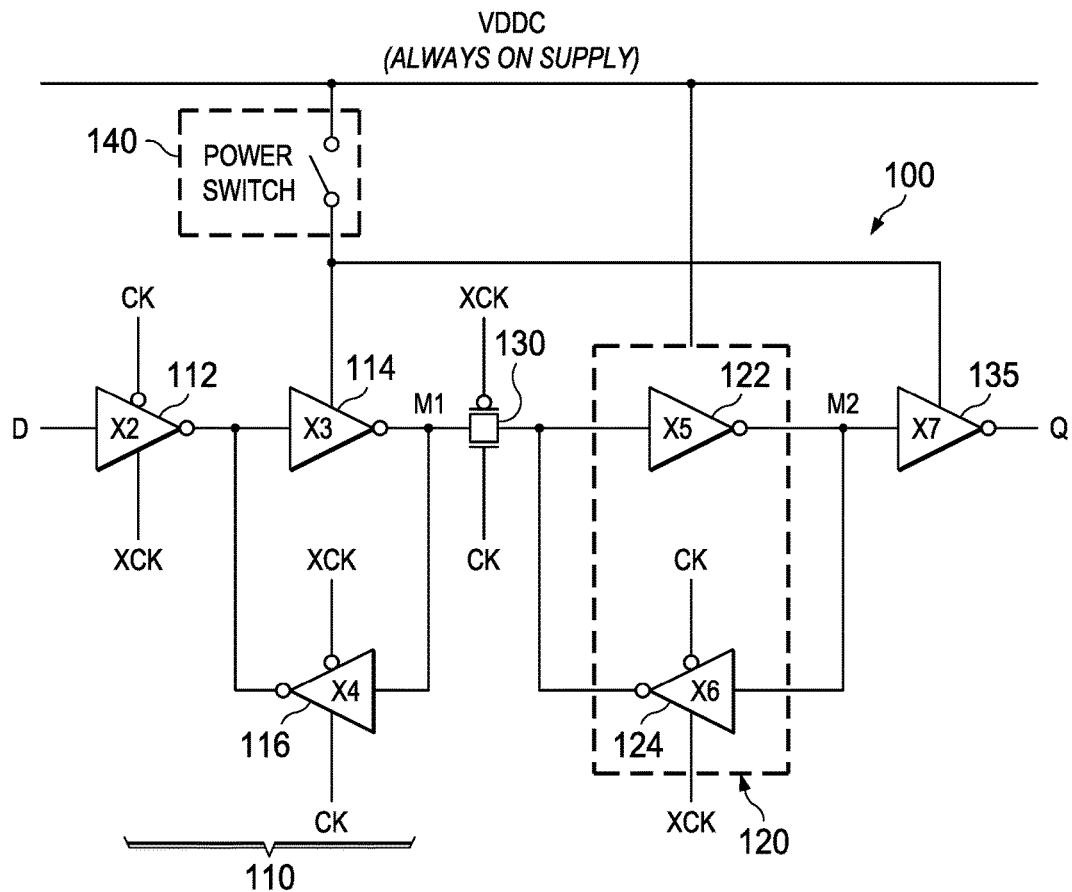
FIG. 1 is a schematic circuit diagram of an illustrative retention flop.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Figure 3:
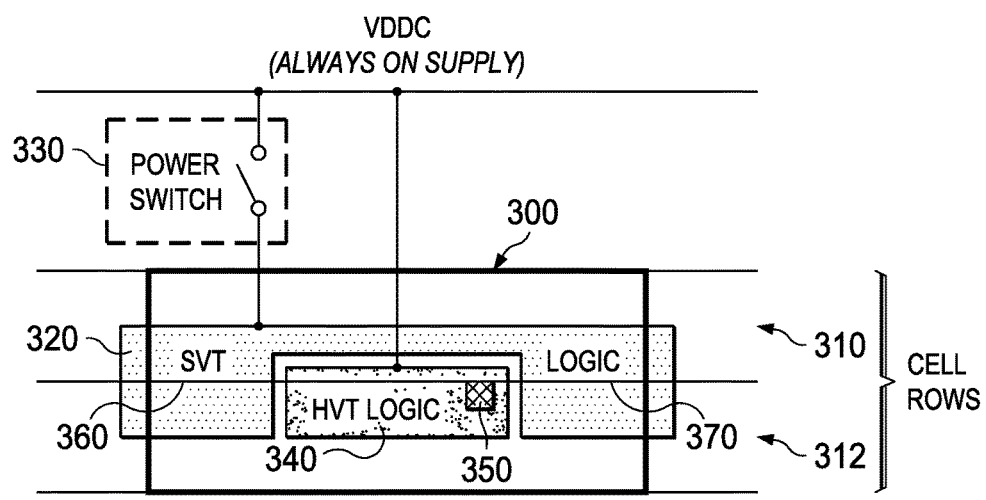
FIG. 3 is a schematic diagram of a double-height logic cell occupying two adjacent cell rows.
Figure 2:
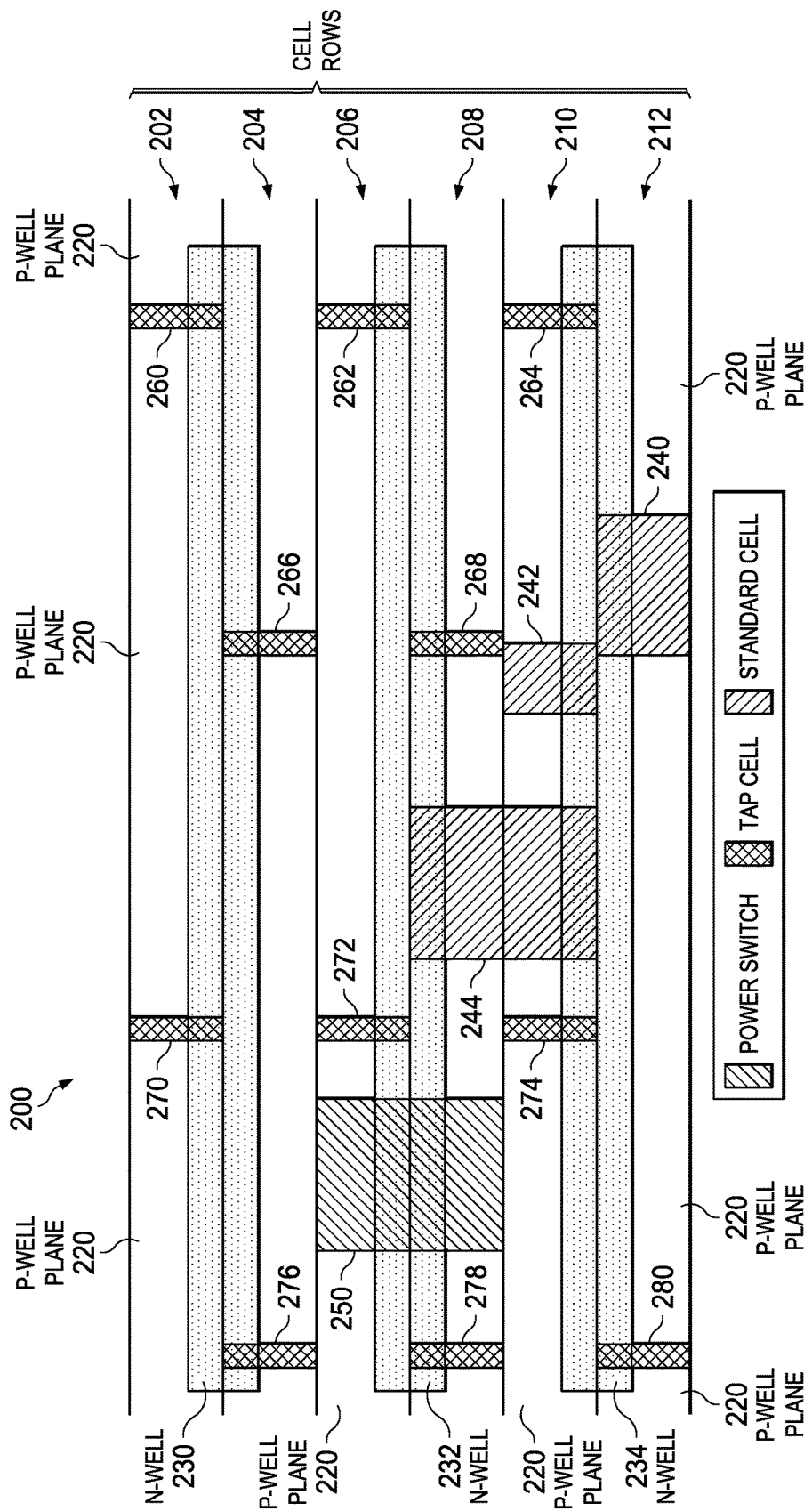
FIG. 2 is a schematic top view of an integrated circuit power domain.
Figure 4:
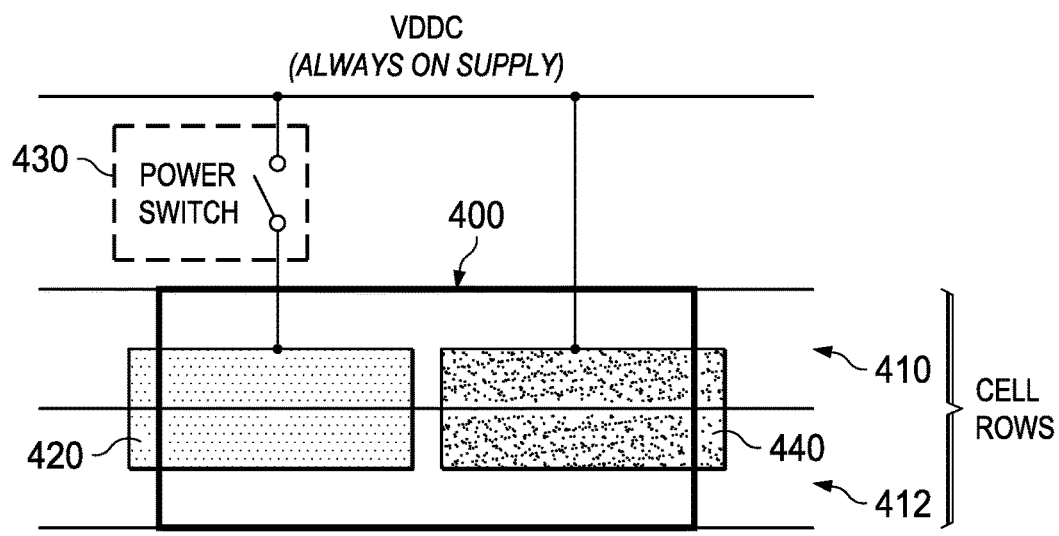
FIG. 4 is a schematic diagram of a double-height logic cell occupying two adjacent cell rows.
Figure 5:
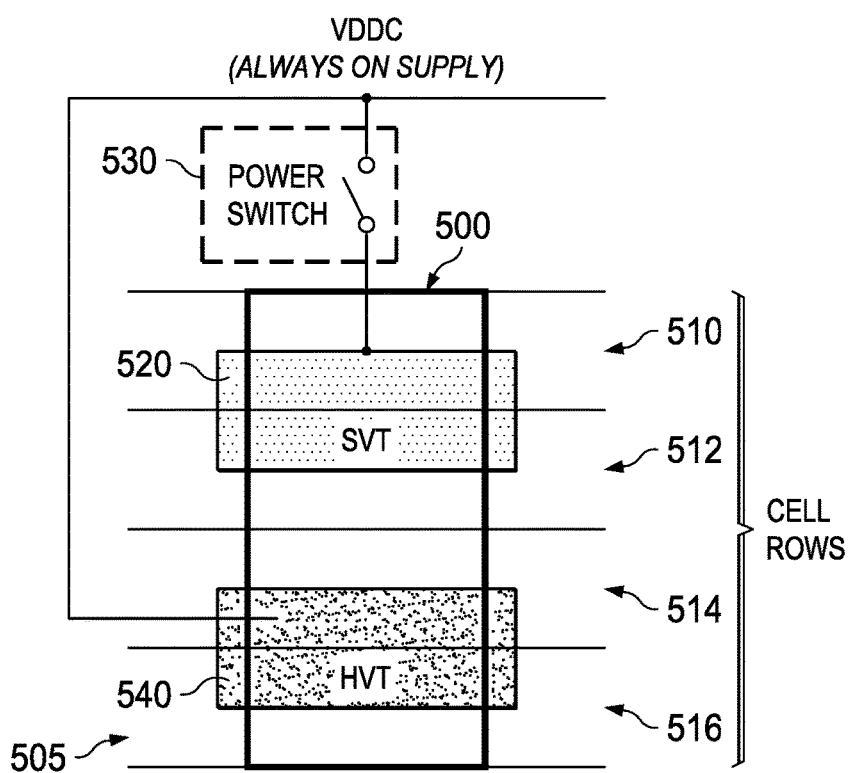
FIG. 5 is a schematic diagram of a quad-height logic cell occupying four adjacent cell rows in accordance with illustrative aspects of the present disclosure.

FIG. 5 is a schematic diagram of a quad-height logic cell 500 occupying four adjacent cell rows 510, 512, 514, 516 in accordance with illustrative aspects of the present disclosure. FIG. 5 shows two substantially parallel n-well rows 520 and 540 disposed on a p-well plane 505. P-well plane 505 is comprised of positively doped (p+) semiconductor material. The n-well rows, or n-well drawings, 520 and 540, each comprise a layer of negatively doped (n+) semiconductor material deposited on top of the p-well plane 505. In the n-well separation scheme of FIG. 5, the n-wells 520 and 540 are spaced apart "vertically," as opposed to "horizontally" in the prior art. Those of skill in the art will recognize that the terms "vertically" and "horizontally" are used here to describe their spatial relationship as represented in figures such as FIG. 5 for purposes of explanation, and may not necessarily describe the actual physical spatial relationships in a given integrated circuit embodying the described aspects of the present disclosure. Thus, logic cell 500 has a footprint that encompasses four contiguous cell rows 510, 512, 514 and 516, as well as two adjacent and parallel n-well rows 520 and 540. In the illustrative embodiment of FIG. 5, n-well row 520 is coupled to a switchable power supply 530 and n-well row 540 is coupled to an always-on power supply $V_{DDC}$. Logic circuitry that can be turned off when the device is turned off or placed in standby mode is placed in cell rows 510 and 512 and uses switchable n-well 520. Logic circuitry that needs to remain powered up at all times is placed in cell rows 514 and 516 and uses always-on n-well 540. For example, in an illustrative embodiment, the logic cell 500 is a retention flop that includes a master latch and a slave latch. In such an embodiment, the standard-voltage-threshold (SVT) logic of the master latch of logic cell 500 is arranged proximate, and utilizes, n-well row 520. The high-voltage-threshold (HVT) logic of the slave latch of logic cell 500 is arranged proximate, and utilizes, n-well row 540. Because each n-well 520 and 540 stretches all the way across the logic cell 500, there is no horizontal n-well spacing requirement within the cell as there is with the prior art solutions of FIGS. 3 and 4.

Figure 6:
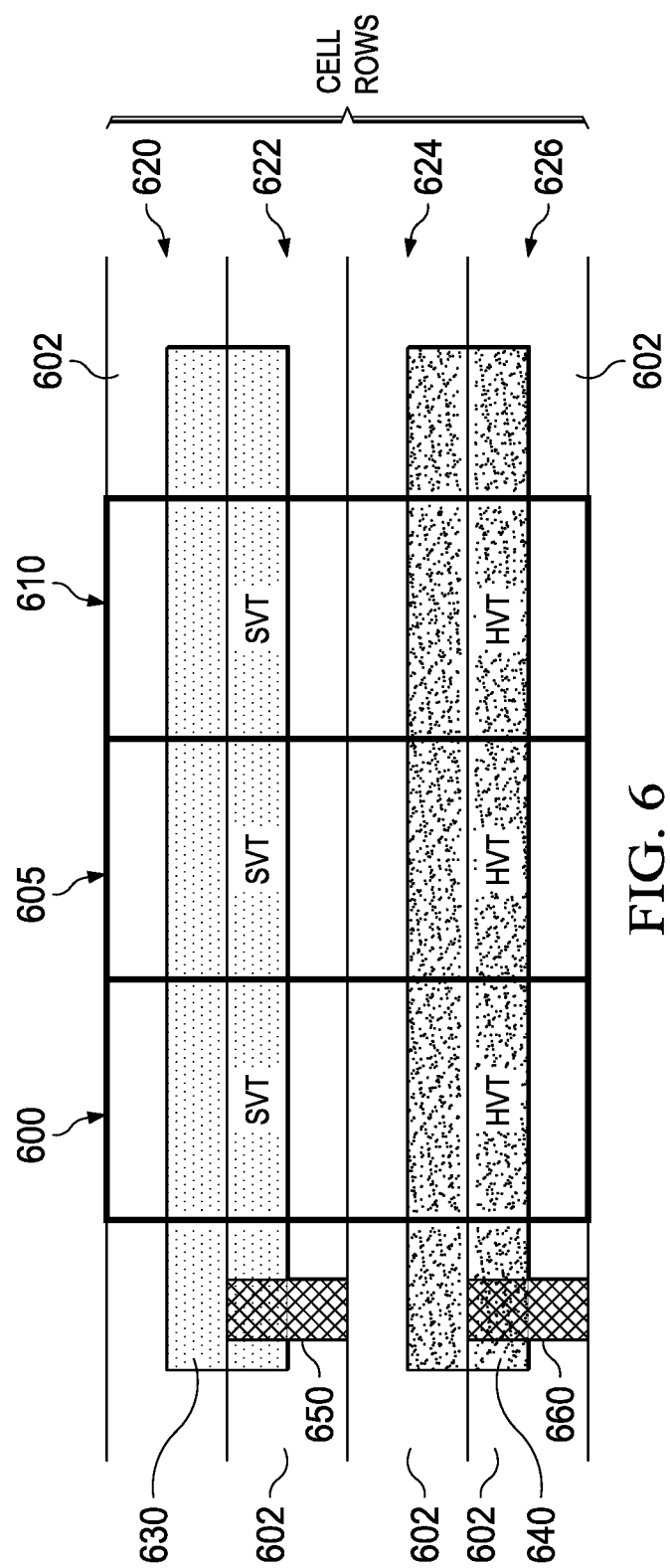
FIG. 6 is a schematic diagram of three adjacent quad-height logic cells occupying four adjacent cell rows in accordance with illustrative aspects of the present disclosure.

FIG. 6 is a schematic diagram of three adjacent quad-height logic cells 600, 605, 610 occupying four adjacent cell rows 620, 622, 624, 626 in accordance with illustrative aspects of the present disclosure. FIG. 6 demonstrates other aspects of the n-well separation scheme shown in FIG. 5. FIG. 6 shows two substantially parallel n-well rows 630 and 640 disposed on a p-well plane 602. Adjacent logic cells 600, 605 and 610 each have a footprint that encompasses cell rows 620, 622, 624 and 626, as well as n-well rows 630 and 640. In an illustrative embodiment, n-well row 630 is coupled to a switchable power supply and n-well row 640 is coupled to an always-on power supply. Logic circuitry that can be turned off when the device is turned off or placed in standby mode is placed in cell rows 620 and 622 and uses switchable n-well 630. Logic circuitry that needs to remain powered up at all times is placed in cell rows 624 and 626 and uses always-on n-well 640. In an illustrative embodiment, the logic cells 600, 605, 610 are retention flops that each include a master latch and a slave latch. In such an embodiment, the standard-voltage-threshold (SVT) logic of the master latch of each logic cell 600, 605, 610 is arranged proximate, and utilizes, n-well row 630. The high-voltage-threshold (HVT) logic of the slave latch of each logic cell 600, 605, 610 is arranged proximate, and utilizes, n-well row 640. Tap cells, such as tap cell 650 in cell row 622, are coupled to n-well row 630 at regular intervals to provide power to the n-well 630 and the drains of its connected transistors. The tap cells, such as tap cell 650, that are coupled to n-well row 630 are coupled to a switchable power supply (not shown). Tap cells, such as tap cell 660 in cell row 626, are coupled to n-well row 640 at regular intervals to provide power to the n-well 640 and the drains of its connected transistors. The tap cells, such as tap cell 660, that are coupled to n-well row 640 are coupled to an always-on power supply.

With the n-well separation scheme of FIG. 6, since n-welt row 630 is continued across cell rows 620 and 622, and n-well row 640 is continued across cell rows 624 and 626, there is no need to put extra tap cells between logic cells 600, 605 and 610. Placement of tap cells such as tap cells 650 and 660 at regular intervals is sufficient. Thus, with this approach there is no area wastage inside the logic cells and no cell placement overhead resulting from a need for extra tap cells.

While the logic cells described with respect to FIGS. 5 and 6 include two n-well rows and four cell rows, the present disclosure is not limited to these embodiments. The present disclosure contemplates logic cells encompassing any plural number, i.e., greater than or equal to 2, n-well rows, and a commensurate number of cell rows.

Commercially available place-and-route (PNR) tools support placement of multiple-height cells and such placement does not result in any overhead in logic cell placement. Such PNR tools can be employed to create a placement site encompassing four cell rows for logic cells such as those described in FIGS. 5 and 6.

With integrated circuit applications demanding increasingly low-power designs, the use of multi-voltage-threshold, split n-well designs is likely to become ubiquitous. The aspects of the present disclosure differentiate over existing solutions in that there is no overhead attendant to implementing the multi-voltage-threshold, split n-well designs described with respect to FIGS. 5 and 6. Thus the logic cells such as those described with respect to FIGS. 5 and 6 can serve as a fundamental building block for any such low-power integrated circuit applications.

Existing integrated circuit designs are generally very frugal in their use of retention flops due to the power and area overheads associated with them. But with high voltage-threshold transistors reducing leakage current by amounts on the order of 100× compared to standard voltage-threshold transistors and the proposed solution eliminating the area overheads, designs implementing 100% retention flops are feasible. This makes ultra-fast power-down and power-up times possible, with ultra-low leakage currents during power-down. This, in turn, makes the sleep and power-down states more lucrative than ever before and extends battery life.

It is noted that the embodiments disclosed herein are illustrative rather than limiting in nature and that a wide range of variations, modifications, changes, and substitutions are contemplated in the foregoing disclosure. Furthermore, in some instances, some features may be employed without a corresponding use of the other features. Accordingly, it is appropriate that the appended claims be construed broadly and in a manner consistent with the broad inventive concepts disclosed herein.

What is claimed is:

1. An integrated circuit device comprising:
   a p-well plane comprising p-type semiconductor material;
   a plurality of substantially parallel n-well rows, each n-well row comprising an n-type layer disposed on the surface of the p-well plane, the plurality of n-well rows comprising a first n-well row and a second n-well row, wherein the first n-well row is coupled to a switchable power supply and the second n-well row is coupled to an always-on power supply; and
   a first logic cell arranged on the p-well plane, the footprint of the logic cell encompassing both the first and second n-well rows.

2. The integrated circuit device of claim 1 wherein the first n-well row is coupled to a first power supply and the second n-well row is coupled to a second power supply.

3. The integrated circuit device of claim 1 wherein the first logic cell comprises at least one transistor having a first voltage threshold and at least one transistor having a second voltage threshold, the at least one transistor having the first voltage threshold utilizing the first n-well row and the at least one transistor having the second voltage threshold utilizing the second n-well row.

4. An integrated circuit device comprising:
a p-well plane comprising p-type semiconductor material;
a plurality of substantially parallel n-well rows, each n-well row comprising an n-type layer disposed on the surface of the p-well plane, the plurality of n-well rows comprising a first n-well row and a second n-well row;
a first logic cell arranged on the p-well plane, the footprint of the logic cell encompassing both the first and second n-well rows;
wherein the first logic cell comprises at least one transistor having a first voltage threshold and at least one transistor having a second voltage threshold, the at least one transistor having the first voltage threshold utilizing the first n-well row and the at least one transistor having the second voltage threshold utilizing the second n-well row; and
wherein the first logic cell comprises at least one standard-voltage-threshold (SVT) transistor and at least one high-voltage-threshold (HVT) transistor, the at least one SVT transistor utilizing the first n-well row and the at least one HVT transistor utilizing the second n-well row.

5. An integrated circuit device comprising:
a p-well plane comprising p-type semiconductor material;
a plurality of substantially parallel n-well rows, each n-well row comprising an n-type layer disposed on the surface of the p-well plane, the plurality of n-well rows comprising a first n-well row and a second n-well row;
a first logic cell arranged on the p-well plane, the footprint of the logic cell encompassing both the first and second n-well rows; and
first, second, third and fourth parallel and contiguous logic cell rows, wherein the first and second logic cell rows are parallel to and share the first n-well row, and the third and fourth logic cell rows are parallel to and share the second n-well row, and wherein the footprint of the first logic cell encompasses the first, second, third and fourth logic cell rows.

6. An integrated circuit device comprising:
a p-well plane comprising p-type semiconductor material;
a plurality of substantially parallel n-well rows, each n-well row comprising an n-type layer disposed on the surface of the p-well plane, the plurality of n-well rows comprising a first n-well row and a second n-well row;
a first logic cell arranged on the p-well plane, the footprint of the logic cell encompassing both the first and second n-well rows; and
a second logic cell arranged on the p-well plane adjacent to the first logic cell, the footprint of the second logic cell encompassing both the first and second n-well rows and encompassing the first, second, third and fourth logic cell rows.

7. An integrated circuit device comprising:
a p-well plane comprising p-type semiconductor material;
a plurality of substantially parallel n-well rows, each n-well row comprising an n-type layer disposed on the surface of the p-well plane, the plurality of n-well rows comprising a first n-well row and a second n-well row; and
a first logic cell arranged on the p-well plane, the footprint of the logic cell encompassing both the first and second n-well rows, wherein the first logic cell comprises a retention flop.

8. The integrated circuit of claim 7 wherein said retention flop comprises a master latch and a slave latch, the master latch comprising at least one SVT transistor that utilizes the first n-well row, and the slave latch comprising at least one HVT transistor that utilizes the second n-well row.

9. An integrated circuit logic cell comprising:
a p-well plane comprising p-type semiconductor material;
a first n-well row comprising an n-type layer disposed on the surface of the p-well plane;
a second n-well row substantially parallel to the first n-well row and comprising an n-type layer disposed on the surface of the p-well plane; and
first, second, third and fourth parallel and contiguous cell rows, wherein the first and second logic cell rows are parallel to and share the first n-well row, and the third and fourth logic cell rows are parallel to and share the second n-well row.

10. The integrated circuit logic cell of claim 9 wherein the first n-well row is coupled to a first power supply and the second n-well row is coupled to a second power supply.

11. The integrated circuit logic cell of claim 9 wherein the first n-well row is coupled to a switchable power supply and the second n-well row is coupled to an always-on power supply.

12. The integrated circuit logic cell of claim 9, further comprising at least one transistor having a first voltage threshold and at least one transistor having a second voltage threshold, the at least one transistor having the first voltage threshold utilizing the first n-well row and the at least one transistor having the second voltage threshold utilizing the second n-well row.

13. The integrated circuit logic cell of claim 9, further comprising at least one standard-voltage-threshold (SVT) transistor and at least one high-voltage-threshold (HVT) transistor, the at least one SVT transistor utilizing the first n-well row and the at least one HVT transistor utilizing the second n-well row.

14. The integrated circuit logic cell of claim 9 wherein the logic cell is a retention flop, and wherein said retention flop comprises a master latch and a slave latch, the master latch comprising at least one SVT transistor that utilizes the first n-well row, and the slave latch comprising at least one HVT transistor that utilizes the second n-well row.

15. An integrated circuit device comprising:
a p-well plane comprising p-type semiconductor material;
a plurality of substantially parallel n-well rows, each n-well row comprising an n-type layer disposed on the surface of the p-well plane, the plurality of n-well rows comprising:
a first n-well row coupled to a switchable power supply; and
a second n-well row coupled to an always-on power supply; and
a logic cell arranged on the p-well plane, the footprint of the logic cell encompassing both the first and second n-well rows, the logic cell comprising at least one standard-voltage-threshold (SVT) transistor and at least one high-voltage-threshold (HVT) transistor, the at least one SVT transistor utilizing the first n-well row and the at least one HVT transistor utilizing the second n-well row.

16. The integrated circuit device of claim 15, further comprising first, second, third and fourth parallel and contiguous logic cell rows, wherein the first and second logic cell rows are parallel to and share the first n-well row, and the third and fourth logic cell rows are parallel to and share the second n-well row.

17. The integrated circuit device of claim 15 wherein the logic cell comprises a retention flop.

18. The integrated circuit of claim 17 wherein said retention flop comprises a master latch and a slave latch, the master latch comprising at least one SVT transistor that utilizes the first n-well row, and the slave latch comprising at least one HVT transistor that utilizes the second n-well row.

\* \* \* \* \*